United States Patent [19]

Bourgeois

[11] Patent Number: 5,469,041
[45] Date of Patent: Nov. 21, 1995

[54] PULSE-CONTROLLED CONVERTER AND ELECTRIC MOTOR CONTROLLER

[75] Inventor: Jean-Marie Bourgeois, Roquefort la Bedoule, France

[73] Assignee: SGS-Thomson Microelectronics, S.A., Pouilly, France

[21] Appl. No.: 88,303

[22] Filed: Jul. 7, 1993

[30] Foreign Application Priority Data

Jul. 10, 1992 [FR] France ................... 92 08637

[51] Int. Cl.$^6$ .................................... H02M 7/5387
[52] U.S. Cl. .................. 318/810; 318/801; 363/26; 363/134
[58] Field of Search ................ 363/25, 56, 26, 363/40–41, 61, 134, 97, 89, 127, 131, 24, 87, 10, 9; 323/241; 388/815, 911, 912, 917, 809, 814; 318/810, 809, 808, 807, 805, 803, 800, 801, 802

[56] References Cited

U.S. PATENT DOCUMENTS

| | | | |
|---|---|---|---|
| 3,678,367 | 7/1972 | McMurray | 363/10 |
| 4,063,146 | 12/1977 | Oliver | 363/87 |
| 4,155,113 | 5/1979 | Simmons | 363/56 |
| 4,672,521 | 6/1987 | Riesco | 363/41 |
| 4,742,441 | 5/1988 | Akerson | 363/97 |
| 4,855,891 | 8/1989 | Paul | 363/61 |
| 4,891,764 | 1/1990 | McIntosh | 318/432 |
| 5,260,861 | 11/1993 | Wert | 363/25 |
| 5,306,988 | 4/1994 | Carobolante et al. | 318/254 |

FOREIGN PATENT DOCUMENTS

| | | |
|---|---|---|
| 0486359 | 5/1992 | European Pat. Off. . |
| 2109184 | 5/1983 | United Kingdom . |

*Primary Examiner*—William M. Shoop, Jr.
*Assistant Examiner*—John W. Cabeca
*Attorney, Agent, or Firm*—Wolf, Greenfield & Sacks

[57] ABSTRACT

The invention relates to a pulse-controlled converter, and a motor electric controller including such a converter. A first switch is controlled by pulses applied to its gate, these pulses being produced by a digital control unit linked to the gate of the first switch via a transformer. The transformer is linked to the digital control unit via a primary circuit and to the gate of the first switch via a secondary circuit. A second switch is directly controlled by the digital control unit. The secondary circuit includes a Zener diode and a resistor which are connected in series between a first terminal of a secondary winding of the transformer and the gate. The digital control unit generates a specific pulse synchronization sequence to control the converter so that problems of short-circuiting on the different bridge arms are avoided.

20 Claims, 3 Drawing Sheets

PULSE-CONTROLLED CONVERTER AND ELECTRIC MOTOR CONTROLLER

BACKGROUND OF THE INVENTION

1. Field of the Invention

This invention relates to a pulse-controlled power converter, its associated controller, and an electric motor controller implementing such converters.

2. Discussion of the Related Art

Such converters are used, for example, in electronic motor controllers, which include electronic power switches in a bridge arm or full-bridge configuration.

Electronically controlled motors are utilized in many applications. Until recently, however, the development of certain applications has been slowed down due to the cost of the converters. In fact, the cost of implementing the necessary power components remained relatively high until a few years ago.

The recent availability of MOSFET power transistors has opened the way to the development of good quality dc-to-ac converters, and the ease with which they can be employed makes them a particularly attractive solution. Additionally, it is known to use converters controlled by a digital system.

Such converters have a low-voltage level (lower stage of bridge arms), the development of which presents no particular difficulties. The digital control unit can be associated with a power amplifier such as a MOSFET power transistor.

The development of the high-voltage circuit (upper stage of bridge arms) is, however, more delicate because of the potential difference that exists between the gate control circuit and the digital control unit. Various solutions have been proposed to implement this circuit.

According to a first solution, high-voltage integrated circuits are used, possibly in conjunction with standard integrated components. The cost of these high-voltage integrated circuits is, however, relatively high, and is not expected to fall significantly in the coming years. Moreover, in order to function, such devices require supplemental circuits such as floating auxiliary power supplies.

Another solution includes using a small high-frequency transformer which is located between each gate control circuit of the MOSFET power transistor and the digital control unit. The primary circuit of this transformer is controlled by a high-frequency signal, the secondary circuit thereof includes a special circuit for driving the gate of the MOSFET power component.

According to a third solution, the input capacitance of the MOSFET power component is used as a passing state memory. In the blocked state, the memory uses a supplemental capacitor. To achieve this, the pulse transformer only requires a few turns.

The object of the present invention is to produce a satisfactory synchronizing pulse-controlled converter as simply as possible, i.e., at a very low cost.

To achieve this objective, it is considered both desirable and possible to provide the digital control unit with a large number of functional features while keeping the operation of the high-voltage circuit as simple as possible.

SUMMARY OF THE INVENTION

The present invention relates to a pulse-controlled converter including at least a first solid-state switch, located in the upper stage of a bridge arm, periodically interrupting a dc current, and a second switch, located in the lower stage of the said bridge arm, the first switch being controlled by pulses applied to its gate.

These pulses are produced by a digital control unit linked to the gate of the first switch via a pulse transformer. This transformer has one primary winding connected to the digital control unit via a buffer circuit, and a secondary winding linked to the gate of the first switch via a simplified secondary circuit.

The second switch is directly controlled by the digital control unit. In accordance with a preferred embodiment of the invention, the secondary circuit includes only a Zener diode and a resistor which are connected in series between a first terminal of the secondary winding and the gate of the first switch.

In addition, an appropriate control sequence generates a negative pulse that is provided to the first switch via the associated transformer when the first switch is open, and whenever any other switch of the converter is switched to the closed or open state. The pulses are perfectly synchronized with the switching of the other switches.

In accordance with alternative embodiments of the invention, the first switch includes an N-channel MOSFET power transistor, or an isolated gate bipolar transistor (IGBT). According to a further embodiment of the invention, the secondary circuit includes a capacitor connected in parallel between the junction point of the Zener diode and the resistor, and the second terminal of the secondary winding. A diode is also connected in parallel across the resistor.

Advantageously, the primary circuit includes a current-voltage adapter buffer which interfaces with the digital control unit and the pulse transformer.

The converter includes a second switch which is referenced at the same potential as the digital control unit, thus allowing the second switch to be directly controlled without an isolation transformer.

When the converter includes several bridge arms, the same digital control unit can be used to produce the control pulses and control the converter. When the electronic controller is intended for ac motors, and includes three converters arranged in a bridge configuration, each first switch is advantageously controlled by positive pulses that close the switch, and negative pulses that open the switch.

A particularly interesting control method is obtained when the digital control unit provides negative pulses to each first switch, via the associated transformer, whenever each of the other first switches closes. Preferably, each converter is associated with a second switch, without memory effect, and which is directly controlled by an amplifier linked to the digital control unit.

A hardware configuration of this kind cannot operate without a well-defined control sequence of the different switches, this sequence being an object of this invention.

BRIEF DESCRIPTION OF THE DRAWINGS

The invention will be better understood from the following purely illustrative and non-limiting detailed description of a particular embodiment of the invention which must be read in conjunction with the accompanying drawings in which.

DETAILED DESCRIPTION

Figure 1:
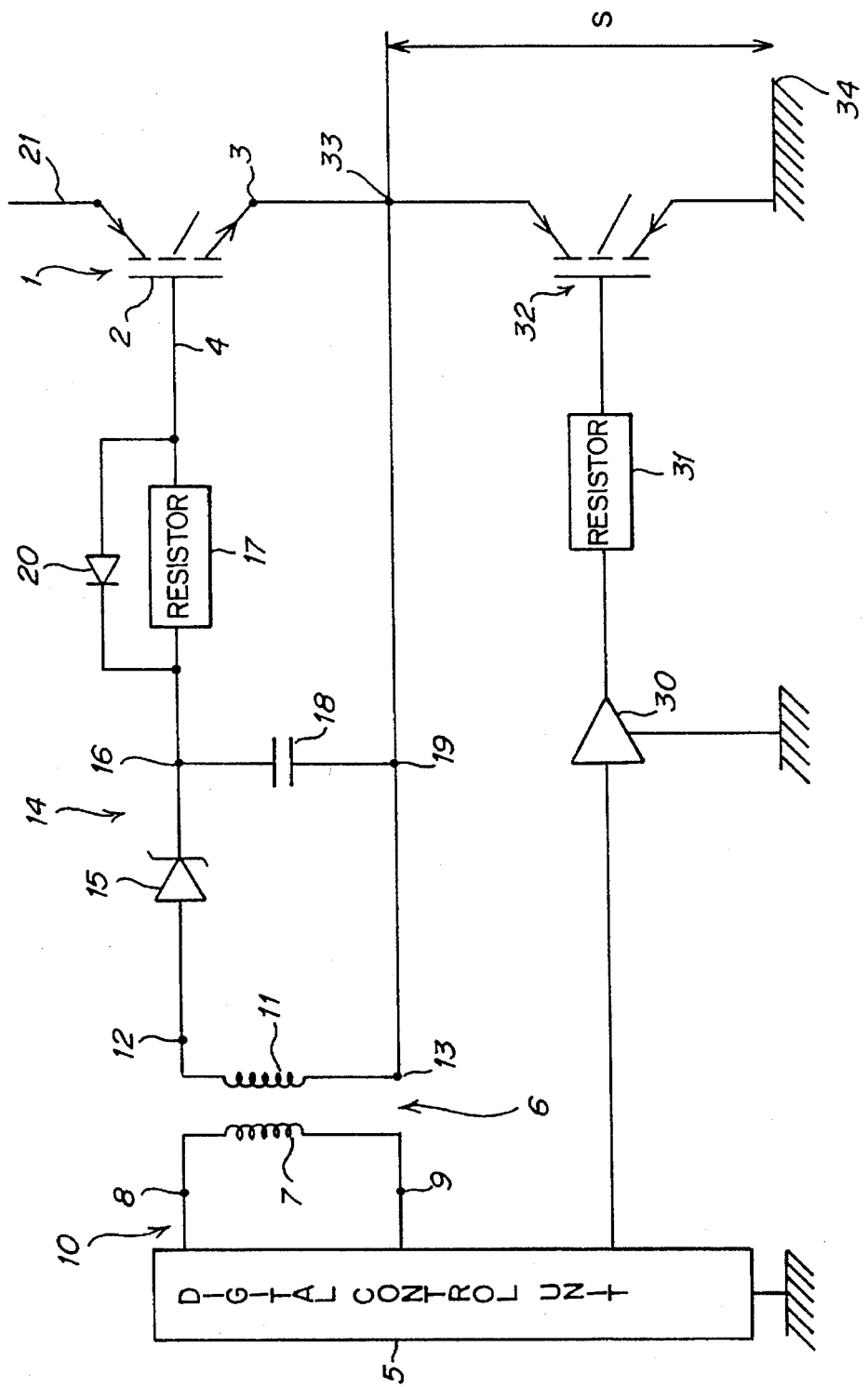
FIG. 1 is a partial block diagram, partial schematic diagram of a converter in accordance with the invention.

The current converter, shown in FIG. 1, includes a first solid-state switch I which is connected to current conductor 21 via its pins or terminals 2 and 3. The open or closed state of this first switch 1 is controlled by the voltage applied to its gate 2.

A secondary circuit 14, which links pin 4 of gate 2 to pin 3 of first switch 1, ensures its control. The circuit 14 includes a secondary winding 11, which together with a primary winding 7, forms transformer 6. Primary winding 7 receives, via its pins 8 and 9, the pulses produced by digital control unit 5, with which it forms primary circuit 10. This primary circuit 10 can include an amplifier.

Secondary circuit 14 includes a Zener diode 15 and a resistor 17 which are mounted in series between pin 12 of secondary winding 11 and pin 4 of gate 2 of first switch 1. Second pin 13 of secondary winding 11 is linked to pin 3 of first switch 1.

Transformer 6, designed to receive pulses, can be produced at low cost, with primary winding 7 and secondary winding 11 each having only a few turns wound on a small core. This transformer isolates primary circuit 10, which includes digital control unit 5, from secondary circuit 14.

The secondary circuit is extremely simple in design. A positive pulse produced by digital control unit 5, and provided to the secondary circuit via transformer 6, places first switch 1 in the closed state. Conversely, a negative pulse places switch 1 in the open state.

A second switch 32 is directly controlled by digital control unit 5 via buffer device 30. The switch 32 is in the closed state when it receives a non-null voltage, and in the open state when this voltage is null.

The output current of the converter is sampled between pin 33, which is common to switches 1 and 32, and ground 34 as illustrated by character S in FIG. 1.

By generating a suitable control sequence, digital control unit 5 is able to control a power current whose main parameters can be easily controlled in conductor 21.

By nature, first switch 1 is seen by the secondary circuit as presenting a natural capacitance between pin 4 of gate 2 and pin 3 of first switch 1. When the first switch is activated by a positive pulse, this natural capacitance holds the first switch in the closed state until a negative pulse is received.

In some applications, the closing of the first switch 1 will need to be delayed. To provide this delay, capacitor 18 is connected between pin 16, common to Zener diode 15 and resistor 17, and pin 19 which is directly connected to second pin 13 of secondary winding 11 and pin 3 of first switch 1. In addition, diode 20 is connected in parallel across resistor 17 between gate pin 4 and pin 16, and in the opposite direction to that of Zener diode 15.

Thus, when digital control unit 5 produces a positive pulse, this pulse charges capacitor 18 with the current passing directly through the Zener diode.

Resistor 17 limits the charge current and determines the moment at which first switch 1 switches in relation to the pulse. Capacitor 18 therefore maintains the passing state since the Zener diode is reverse-biased and maintains current on pin 4.

Conversely, a negative pulse provided by digital control unit 5 will balance the Zener voltage, causing capacitor 18 and the input capacitor to discharge, and therefore first switch 1 to open. Second switch 32 is referenced at the same potential as the control circuit and can be directly controlled by buffer 30 via resistor 31.

A hardware configuration of this kind cannot operate without a well-defined control sequence of the different switches, which is outlined below.

a) The switching sequence of the first switch is as follows:

a positive voltage pulse is applied to the primary winding of the transformer, thereby causing the input capacitance of the first switch to charge via the resistor and the diode, thus causing the switch to conduct;

consecutively, the charges are held in the gate capacitor of the switch, due to the Zener diode, thereby keeping the switch in the conducting state;

a negative voltage pulse applied to the primary winding of the transformer, corresponding to the Zener diode voltage, will discharge the input capacitance of the first switch and block it.

b) A positive pulse must be applied to the primary winding of the transformer:

whenever the first switch has to be switched from the open state to the closed state; and to refresh the charge of its input capacitance, when the closed state duration is long;

c) A negative pulse must be applied to the primary winding of the transformer:

whenever the first switch has to be switched from the closed state to the open state; and when, with the first switch being in the open state, the second switch or any other switch in the converter is switched to the closed or open state, and the pulses must be applied in a perfectly synchronous way.

Figure 2:
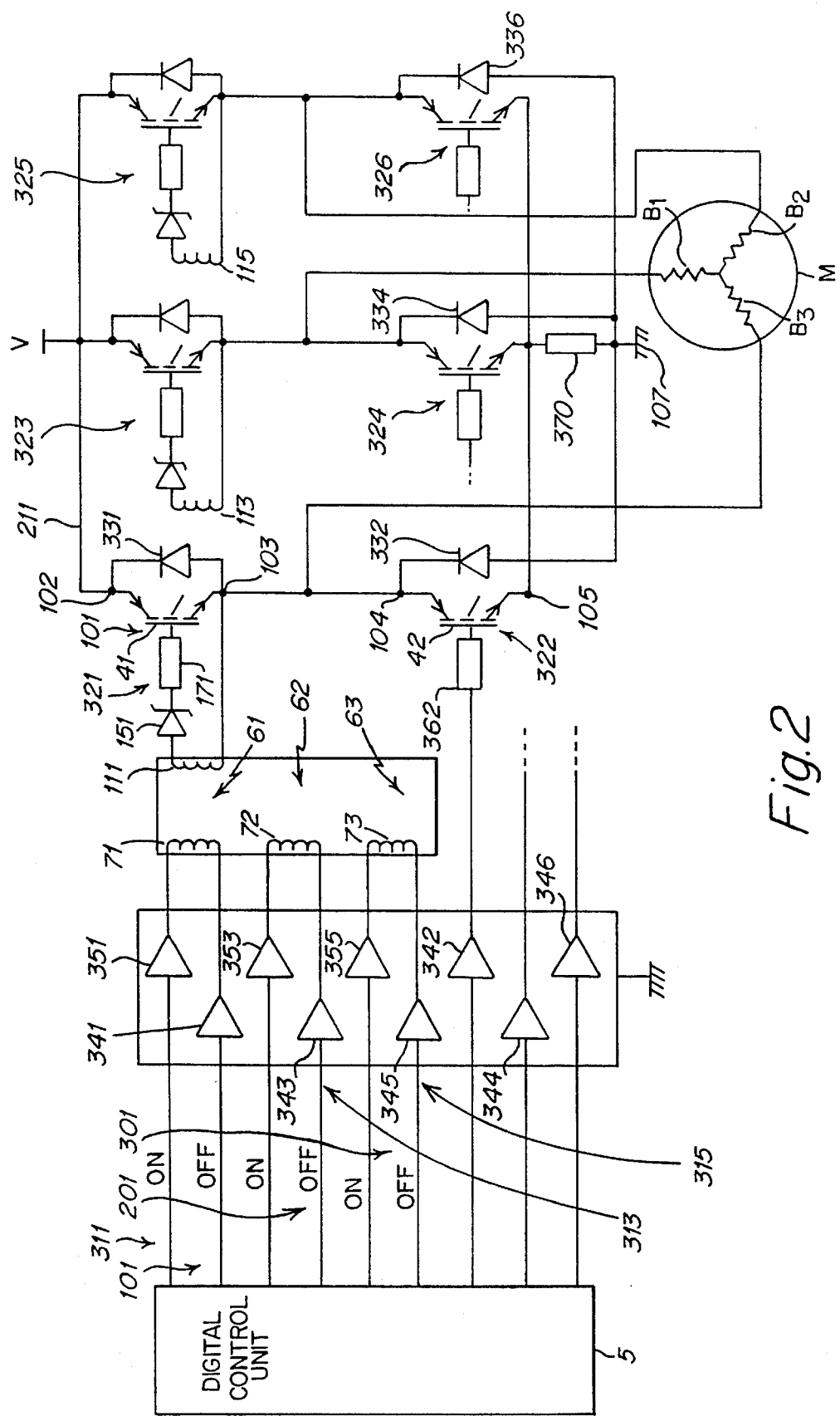
FIG. 2 is a partial block diagram, partial schematic diagram of an electronic ac motor controller in accordance with the invention.

The circuit diagram of an electronic controller for an ac electric motor, in accordance with the invention, is shown in FIG. 2. Three secondary circuits 321, 323, 325 are each controlled by digital control unit 5 via transformers 61, 62, 63. For reasons of clarity, only secondary winding 111 is shown opposite the corresponding primary winding 71. Note that in the actual embodiment, secondary windings 113 and 115 (not shown) are associated with primary windings 72 and 73, respectively. Since the components of these different secondary circuits are identical, the description will be limited to circuit 321.

Zener diode 151 is mounted in series with a resistor 171 between one of the pins of secondary winding 111 and gate 41 of first switch 101. Pins 102 and 103 of first switch 101 are connected to current line 211. Diode 331 is mounted in parallel with the first switch across pins 102 and 103. Primary circuit 311 is linked to digital control unit 5 via two amplifiers 341 and 351. Primary circuits 313 and 315 are of the same type and include amplifiers 343, 353, 345 and 355, respectively.

Three other switches, 322, 324, 326, termed "second switches", are each associated with one of the first switches. Pin 104 of second switch 322 is connected to pin 103 of corresponding first switch 101, and the second pin 105 of switch 322 is connected to ground 107 via component 370. High voltage V is established between pin 102 and ground 107. Gate 42 of switch 322 is linked to digital control unit 5 via resistor 362 and amplifier 342. Switches 324 and 326 are arranged similarly to switch 322 and are connected to amplifiers 344 and 346, respectively.

Diode 332 is connected between pin 104 of the second switch 322, common with pin 103 of the first switch, and ground. Diodes 334 and 336 are similarly connected with respect to Switches 324 and 326, respectively.

Motor windings BI, B2, B3 are each connected by one of its pins to the common pin of first and second switches 103–104. The first switches are controlled by positive and negative pulses, the secondary circuits maintaining the memory of the closed state caused by a positive pulse until a negative pulse is received. Second switches 322, 324, 326 are controlled directly. These switches, controlled by digital control unit 5 via amplifiers 342, 344, 346, are in the closed state when they receive a non-null voltage, and in the open state when they receive a null voltage.

Figure 3:
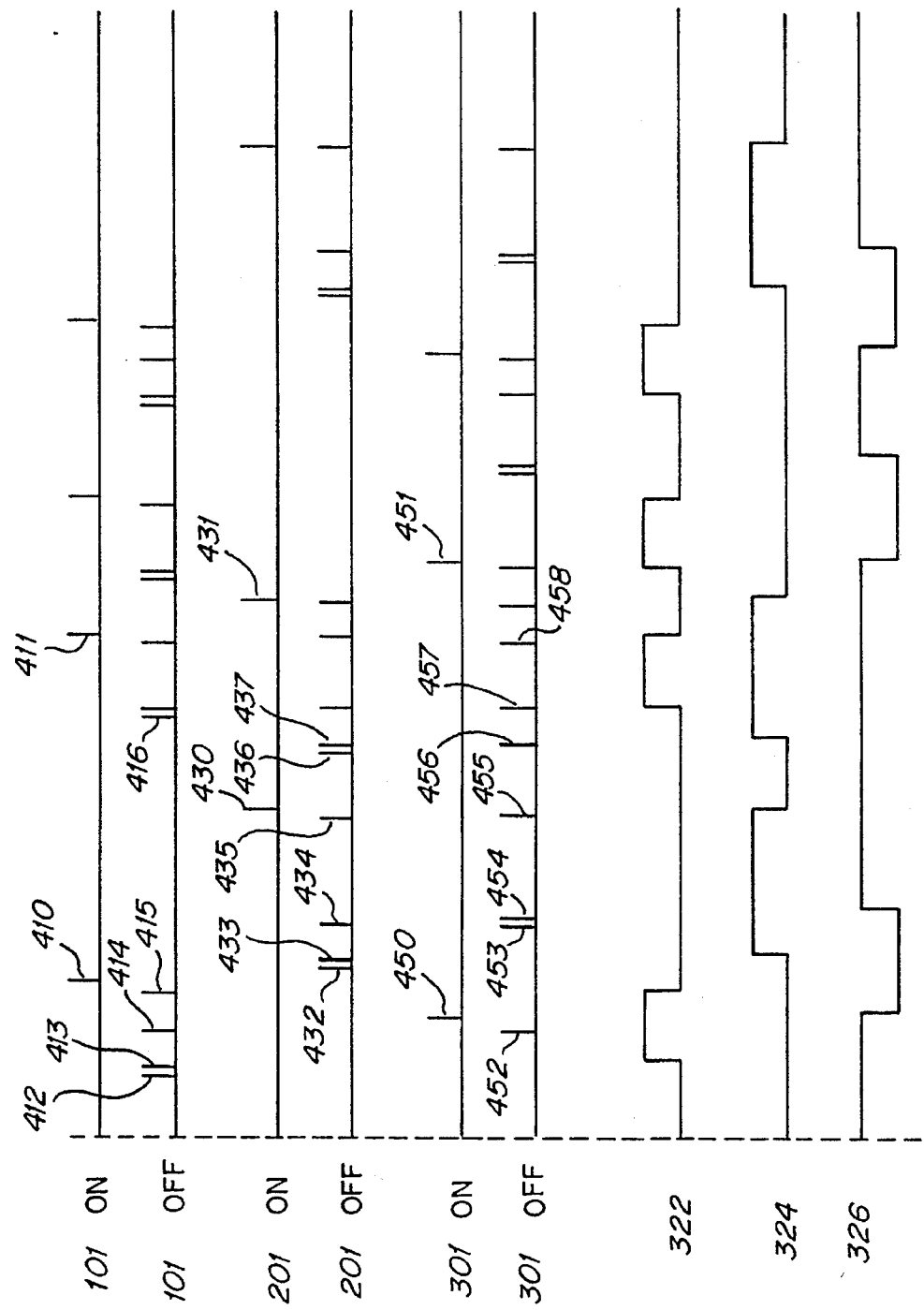
FIG. 3 is a timing diagram of the control waveforms of the switches shown in FIG. 2.

The control sequences of each pair of switches 101–322, 201–324, 301–326 are similar to one another and are shown in FIG. 3. For the pair 101–322:

Switching sequence 101 of the first switch is the following.

a) A positive voltage pulse 410 is applied to the primary winding of the transformer, thereby charging the input capacitance of the first switch via the resistor and diode and causing the switch to conduct.

A positive pulse is therefore applied:

whenever the first switch has to be switched from the open state to the closed state (at 410–411, for example), and to refresh the charge of its input capacitance when the closed state duration is long (not shown here).

b) Consecutively, the charges are maintained in the gate capacitor of the switch, due to the Zener diode, thereby maintaining the switch in the conducting state.

c) A negative voltage pulse 412–416 applied to the primary of the transformer and corresponding to the Zener diode voltage will discharge the input capacitance of the first switch and block it.

A negative pulse is therefore applied:

whenever the first switch has to be switched from the closed state to the open state (at 412–416, for example), and when, with the first switch in the open state, the second switch or any other switch in the converter is switched to the closed or open state, and the pulses are applied in a perfectly synchronized way (at 413–414–415, for example).

The switches of second switch 31 are shown in sequence 322.

For the pair 201–324:

Switching sequence 201 of the first switch includes the following:

a) a positive voltage pulse 430 is applied to the primary winding of the transformer, thereby causing the input capacitance of the first switch to charge via the resistor and diode and causing the switch to conduct.

A positive pulse is therefore applied:

whenever the first switch has to be switched from the open state to the closed state (at 430–431, for example), and to refresh the charge of its input capacitance when the closed state duration is long (not shown here).

b) Consecutively, the charges are held in the gate capacitor of the switch, due to the Zener diode, thereby keeping the switch in the conducting state.

c) A negative voltage pulse 436 applied to the primary winding of the transformer and corresponding to the Zener diode voltage will discharge the input capacitance of the first switch and block it.

A negative pulse is therefore applied:

whenever the first switch has to be switched from the closed state to the open state (at 432–436, for example), and when, with the first switch in the open state, the second switch or any other switch in the converter is switched to the closed or open state, and the pulses are applied in a perfectly synchronous way (433–434–435–437, for example).

For the pair 301–326:

Switching sequence 301 of the first switch is the following:

a) a positive voltage pulse 450 is applied to the primary winding of the transformer, thereby causing the input capacitance of the first switch to charge via the resistor and diode and causing the switch to conduct.

A positive pulse is therefore applied:

whenever the first switch has to be switched from the open state to the closed state (at 450–451 for example), and to refresh the charge of its input capacitance when the closed state duration is large (not shown here).

b) Consecutively, the charges are held in the gate capacitor of the switch, due to the Zener diode, thereby keeping the switch in the conducting state.

c) A negative voltage pulse 453 applied to the primary winding of the transformer and corresponding to the Zener diode voltage will discharge the input capacitance of the first switch and block it.

A negative pulse is therefore applied:

whenever the first switch has to be switched from the closed state to the open state (at 452–453, for example), and when, with the first switch in the open state, the second switch or any other switch in the converter is switched to the closed or open state, and the pulses are applied in a perfectly synchronous way (at 454–455–456–457–458, for example).

Having thus described one particular embodiment of the invention, various alterations, modifications, and improvements will readily occur to those skilled in the art. Such alterations, modifications, and improvements are intended to be part of this disclosure, and are intended to be within the spirit and scope of the invention. Accordingly, the foregoing description is by way of example only and is not intended as limiting. The invention is limited only as defined in the following claims and the equivalents thereto.

What is claimed is:

1. A pulse-controlled converter comprising:

a digital control unit to produce control pulses;

a transformer, coupled to the digital control unit, receiving control pulses from the digital control unit, and having a primary winding and a secondary winding;

a primary circuit, coupled between the digital control unit and the primary winding, amplifying pulses provided by the digital control unit to the transformer;

a first switch, including a gate terminal, coupled to a dc current source, receiving dc current and passing dc current when in a closed state;

a secondary circuit, coupled between the secondary winding and the gate terminal of the first switch, cooperating with the digital control unit to provide controlling pulses to the first switch to control the first switch to periodically interrupt the dc current; and a second switch, coupled to the digital control unit and to the first switch, receiving dc current from the first switch, and controlled by the digital control unit to sample the dc current and provide an ac output;

wherein said secondary circuit provides a pulse to the first switch when the first switch is open and the second switch switches states.

2. A converter as claimed in claim 1 wherein the secondary circuit includes a zener diode and a resistor connected in series between the secondary winding and the gate of the first switch.

3. A converter as claimed in claim 2 wherein the first switch includes an N-channel MOSFET power transistor.

4. A converter as claimed in claim 2 wherein the first switch includes an isolated gate bipolar transistor.

5. A converter as claimed in claim 2 wherein the secondary circuit includes a capacitor coupled to the zener diode and the secondary winding, and a diode connected in parallel with the resistor.

6. A converter as claimed in claim 2 wherein the primary circuit includes a buffer device.

7. An electronic motor controller comprising:
a digital control unit to produce control pulses; and
at least one pulse-controlled converter coupled to the digital control unit, each pulse-controlled converter comprising:
a transformer, coupled to the digital control unit, receiving control pulses from the digital control unit, and having a primary winding and a secondary winding;
a primary circuit, coupled between the digital control unit and the primary winding, amplifying pulses provided by the digital control unit to the transformer;
a first switch, including a gate terminal, coupled to a dc current source, receiving dc current and passing dc current when in a closed state;
a secondary circuit, coupled between the secondary winding and the gate terminal of the first switch, cooperating with the digital control unit to provide controlling pulses to the first switch to control the first switch to periodically interrupt the dc current; and
a second switch, coupled to the digital control unit and to the first switch, receiving dc current from the first switch, and controlled by the digital control unit to sample the dc current and provide an ac output;
wherein said secondary circuit provides a pulse to the first switch when the first switch is open and the second switch switches states.

8. An electronic motor controller as claimed in claim 7 wherein the at least one converter includes three converters arranged in a bridge configuration, and wherein each first switch is controlled by positive pulses to close and negative pulses to open.

9. An electronic motor controller as claimed in claim 8 wherein the first switch is coupled to the digital controlling unit, and the digital control unit provides negative pulses to one first switch when the one first switch is in the open state and any other first switches closes.

10. An electronic motor controller as claimed in claim 8 further comprising an amplifier, coupled to the digital control unit, amplifying pulses provided by the digital control unit.

11. An electronic motor controller as claimed in claim 10 wherein each secondary circuit includes a zener diode and a resistor connected in series between the secondary winding and the gate of the first switch.

12. A pulse-controlled converter comprising:
means for producing control pulses;
a transformer, coupled to the means for producing control pulses, receiving the control pulses, and having a primary winding and a secondary winding;
means, coupled between the means for producing control pulses and the primary winding, for amplifying pulses provided by the means for providing to the transformer;
a first means for switching, including a gate terminal, coupled to a dc current source, receiving dc current and passing the dc current when in a closed state;
means, coupled between the secondary winding and the gate terminal of the first means for switching, cooperating with the means for producing control pulses, for controlling the first means for switching to periodically interrupt the dc current;
a second means for switching, coupled to the means for producing control pulses and the first means for switching, receiving dc current from the first means for switching, and controlled by the means for producing control pulses to sample the dc current and produce an ac output;
wherein said means for controlling provides a pulse to the first means for switching when the first means for switching is open and the second means for switching switches states.

13. A pulse-controlled converter as claimed in claim 12 wherein the means for controlling includes a zener diode and a resistor connected in series between the secondary winding and the gate terminal of the first means for switching.

14. A pulse-controlled converter as claimed in claim 13 wherein the first means for switching includes an N-channel MOSFET power transistor.

15. A pulse-controlled converter as claimed in claim 14 wherein the first means for switching includes an isolated gate bipolar transistor.

16. A pulse-controlled converter as claimed in claim 15 wherein the means for controlling includes a capacitor coupled to the zener diode and the secondary winding, and a diode connected in parallel with the resistor.

17. A pulse-controlled converter as claimed in claim 16 wherein the means for amplifying includes a buffer device.

18. A method for converting DC power to AC power comprising the steps of:
producing control pulses using a digital control unit;
providing the control pulses to a control circuit;
electrically isolating the digital control unit from the control circuit;
providing dc current to a first switch, coupled to the control circuit;
in response to the control pulses, controlling operation of the first switch to periodically interrupt the dc current, using the control circuit; and
sampling the periodically interrupted dc current to provide an ac output;
wherein a control pulse is provided to said first switch when said ac current is interrupted and said sampling starts and ends.

19. A method for converting DC power to AC power as claimed in claim 18 wherein the step of controlling operation of the first switch includes the step of using a zener diode and a resistor connected in series, and coupled to the first switch, to control operation of the first switch.

20. A method for converting DC power to AC power as claimed in claim 19 wherein the step of electrically isolating includes the step of using a transformer, having a primary winding coupled to the digital control unit and a secondary winding coupled to the control circuit, to electrically isolate the digital control unit from the control circuit.

* * * * *

UNITED STATES PATENT AND TRADEMARK OFFICE
CERTIFICATE OF CORRECTION

PATENT NO. : 5,469,041
DATED : November 21, 1995
INVENTOR(S) : Jean-Marie Bourgeois It is certified that error appears in the above-indentified patent and that said Letters Patent is hereby corrected as shown below:

Title page, item [73], Assignee: should read--SGS-Thomson Microelectronics, S.A., Saint Genis, Pouilly, France--.

Signed and Sealed this

Twelfth Day of March, 1996

*Attest:*

BRUCE LEHMAN

*Attesting Officer*     *Commissioner of Patents and Trademarks*